United States Patent [19]

Higuchi et al.

[11] 4,314,360

[45] Feb. 2, 1982

[54] SEMICONDUCTOR MEMORY DEVICE

[76] Inventors: Mitsuo Higuchi, 5-13, Yutenji 2-chome, Meguro-ku, Tokyo 153; Kiyoshi Miyasaka, 577-45, Iijima-cho, Totsuka-ku, Yokohama-shi, Kanagawa 244, both of Japan

[21] Appl. No.: 150,800

[22] Filed: May 19, 1980

[30] Foreign Application Priority Data

May 26, 1979 [JP] Japan .................................. 54-65349

[51] Int. Cl.³ .............................................. G11C 11/40
[52] U.S. Cl. .................................... 365/203; 365/210; 357/45

[58] Field of Search ............... 365/174, 182, 203, 189, 365/51, 63, 210; 357/45

[56] References Cited

U.S. PATENT DOCUMENTS 4,112,508 9/1978 Itoh ..................................... 365/203

Primary Examiner—Terrell W. Fears

[57] ABSTRACT

A semiconductor memory device comprising a memory cell array consisting of a plurality of cell transistors, and additional transistors connected between bit lines and a reference potential point for suppressing the lowering of the potential of a bit line when said semiconductor memory device is changed from a non-operative state to an operative state.

4 Claims, 5 Drawing Figures

SEMICONDUCTOR MEMORY DEVICE

TECHNICAL FIELD

The present invention relates to a semiconductor memory device and, more particularly, an integrated circuit semiconductor memory device, such as an erasable, programmable read only memory (EPROM) device of the floating gate avalanche injection metal oxide semiconductor (FAMOS) type.

The circuit of a prior art EPROM device of the double gate FAMOS type is illustrated in FIG. 1. Drain electrodes of double gate FAMOS transistors $T_{11}$, $T_{12}$ ... $T_{1n}$; $T_{21}$, $T_{22}$ ... $T_{2n}$; ... $T_{m1}$, $T_{m2}$ ... $T_{mn}$ are connected to bit lines $B_1$, $B_2$ ... $B_n$. Gate electrodes of the double gate FAMOS transistors are connected to word lines $W_1$, $W_2$ ... $W_m$ which are controlled by decoders $DW_1$ $DW_2$ ... $DW_m$. Source electrodes of the double gate FAMOS transistors are connected to a point of reference potential such as ground. Thus, each of the double gate FAMOS transistors constitutes a one-bit cell of the memory device having a memorizing capacity of m x n bits. Load circuits 11, 12 ... 1n are connected between the bit lines $B_1$, $B_2$ ... $B_n$ and a power source $V_{cc}$. Information in the form of "1" or "0" in the memory device of FIG. 1 can be read out in accordance with the ON state or the OFF state of each of n double gate FAMOS transistors connected to a word line selected from the m word lines.

Since the signal $\overline{PD}$ applied to the decoders are LOW during the non-operative period, in the memory device of FIG. 1, the potentials of the outputs of the decoders connected to the word lines are switched to HIGH and, hence, the potentials of all of the word lines are switched to HIGH during the non-operative period, in order to reduce power consumption.

The changes of the potentials of the word lines $w_1$ and $w_2$ through $w_m$ and the bit line $B_1$ are illustrated in FIG. 2. It is assumed that the word line $w_1$ is selected during the period $t_1$ to $t_2$ and the above described reduction of power consumption is effected during the period $t_2$ to $t_3$. The potential of the bit line $B_1$ is HIGH during the period $t_1$ to $t_2$ if the cell transistor selected by the potential of the word line $w_1$ is in the OFF state. During the period $t_2$ to $t_3$, in which the reduction of power consumption is effected, the potentials of the non-selected word lines $w_2$ through $w_m$ are made HIGH, and the potential of the bit line $B_1$ is made LOW, if at least one cell connected to the bit line becomes ON state. The memory device is again rendered operative after the power reduction period $t_2$ to $t_3$ is over. The potential of selected word line $w_1$ remains HIGH and the potentials of non-selected word lines $w_2$ through $w_m$ fall to a LOW level.

However, the potential of the bit line $B_1$, which has been kept LOW during the period $t_2$ through $t_3$, cannot directly switch to a HIGH level. If only a few number of cells in ON state are connected to the bit line, after $t_3$, the potential of the bit line $B_1$ falls to a much lower level during the period $t_3$ to $t_4'$. This is because capacitance coupling exists due to parasitic capacitance between the drain electrode of the cell transistor connected to the bit line and the gate electrode connected to the word line of the cell transistor; if a greater number of cells in ON state are connected to the bit line, the potential of the bit line is clamped by the reference potential through such cells in the ON state and accordingly does not fall below the reference potential; accordingly, the potential of the bit line after $t_3$ depends upon the number of cells in the ON state connected to the bit line, and; accordingly, the fewer the number of cells in the ON state, the lower the potential of the bit line. Thus, a longer time is required to complete the charging of the bit line so as to attain the HIGH potential of the bit line, with the result that the speed of operation of the memory device is reduced. This reduction of the operation speed is disadvantageous in a semiconductor memory device.

The general characteristics of the prior art EPROM device are disclosed in, for example, the thesis "16 K Bit Ultraviolet Ray Irradiation Erasure Type EPROM", by Kanichi Harima et al, Mitsubishi Denki Giho, Volume 53, No. 7, pages 487 to 490, 1979.

The present invention has been proposed in order to prevent the above described disadvantages in the prior art semiconductor memory device.

DISCLOSURE OF THE INVENTION

It is the main object of the present invention to provide a semiconductor memory device, in which the reduction of the power consumption is effected by switching the potentials of all of the word lines to HIGH during the non-operative period, without reducing the operational speed of the semiconductor memory device.

In accordance with the present invention a semiconductor memory device is provided which comprises a plurality of word lines, a plurality of bit lines and a plurality of cell transistors, each of which is connected between one of the bit lines and a point of reference potential, the semiconductor memory device is characterized in that additional transistors are connected between the bit lines and the point of reference potential, whereby the suppression of the lowering of the potential of a bit line is effected by the additional transistors when the semiconductor memory device changes from the non-operative state into the operative state.

DESCRIPTION OF THE PREFERRED EMBODIMENTS

Figure 3:
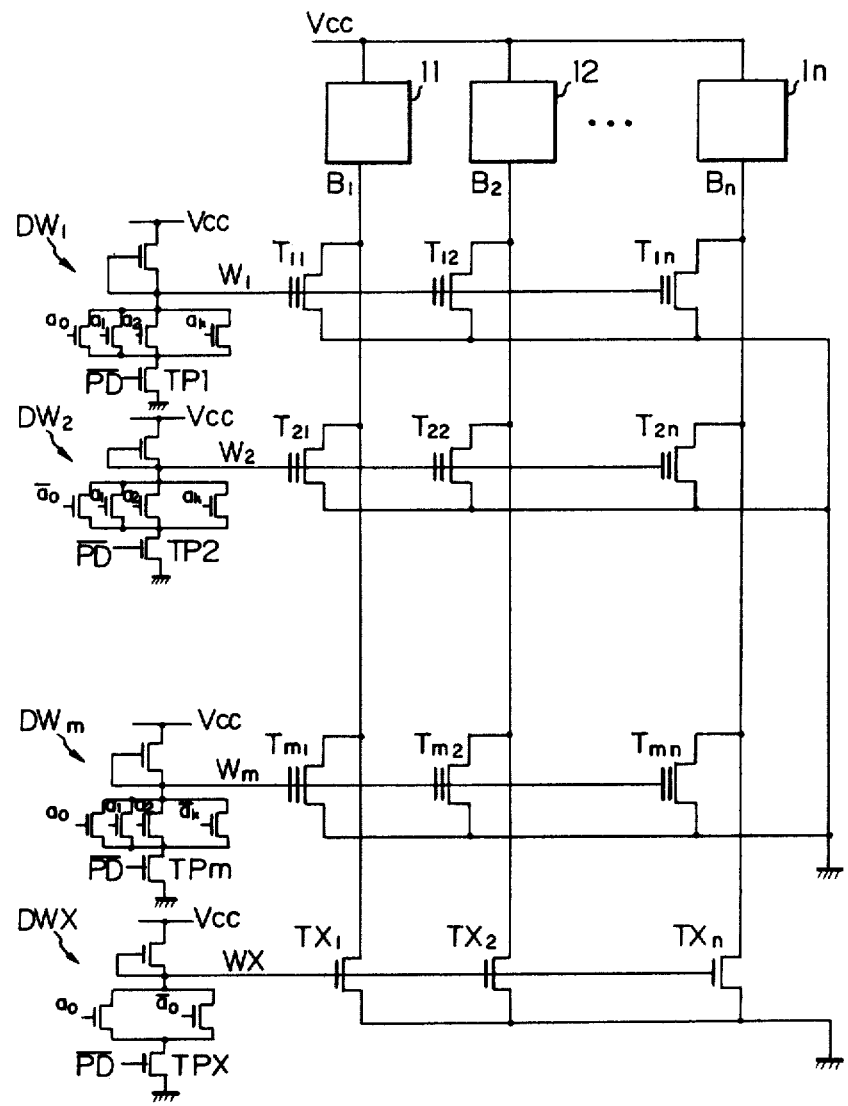
FIG. 3 illustrates a circuit of the semiconductor memory device in accordance with an embodiment of the present invention.
Figure 4:
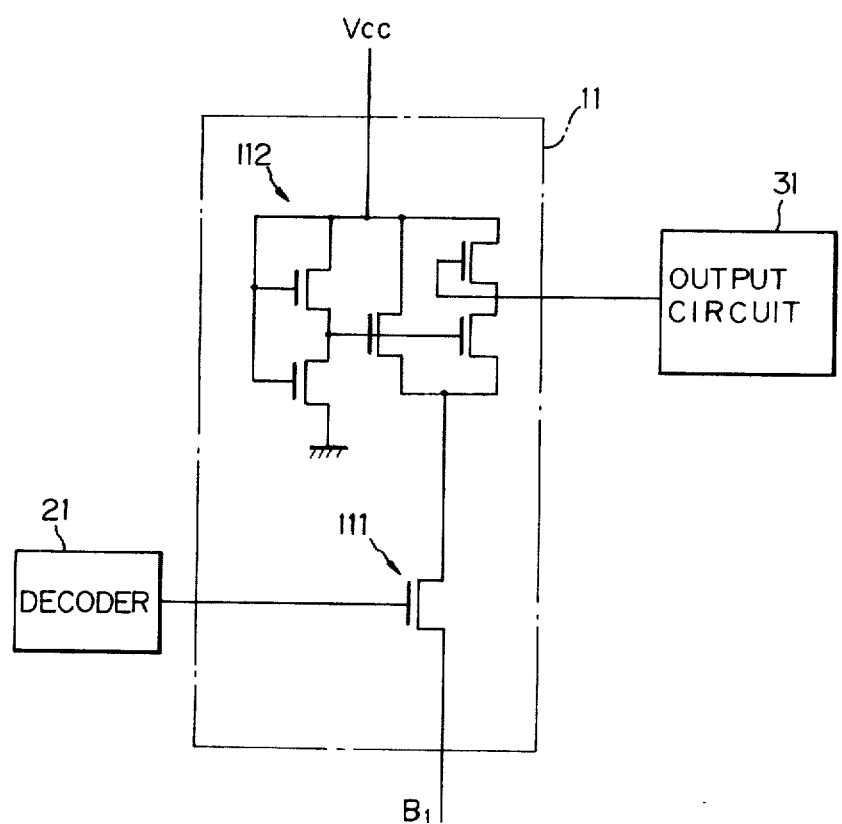
FIG. 4 illustrates, as an example, the details of the load circuit used in the device of FIG. 3.

The semiconductor memory device in accordance with an embodiment of the present invention is illustrated in FIG. 3. In the device of FIG. 3, an additional array of transistors $TX_1$, $TX_2$ ... $TX_n$ for suppressing the change of the potential of the bit lines is inserted between the bit lines and ground. The conductance of each of the added transistors $TX_1$, $TX_2$ ... $TX_n$ is approximately one tenth of the total conductance of all of the cell transistors which are connected to a bit line and turned ON. Except for the addition of this array of transistors $TX_1$, $TX_2$ ... $TX_n$, a word line WX and a decoder DWX for the additional array of transistors, the device of FIG. 3 is the same as the device of FIG. 1. The potential of the word line WX does not become HIGH except for the non-operative period. Such a prevention for being at HIGH potential is achieved by the application of the same address signals $a_o$ and $\bar{a}_o$ to the NOR gate portion of the decoder DWX, as illustrated in FIG. 3. The load circuits 11, 12 . . . 1n are connected between the bit lines $B_1$, $B_2$ . . . $B_n$ and the power source $V_{cc}$ as in the device of FIG. 1. An example of the load circuit 11 is illustrated in FIG. 4. The load circuit 11 of FIG. 4 comprises a transistor 111 for selecting the bit line $B_1$ which receives a signal from a bit line selecting decoder 21, and a circuit 112 for amplifying the information of the bit line $B_1$ which produces an output signal to an output circuit 31.

Figure 5:
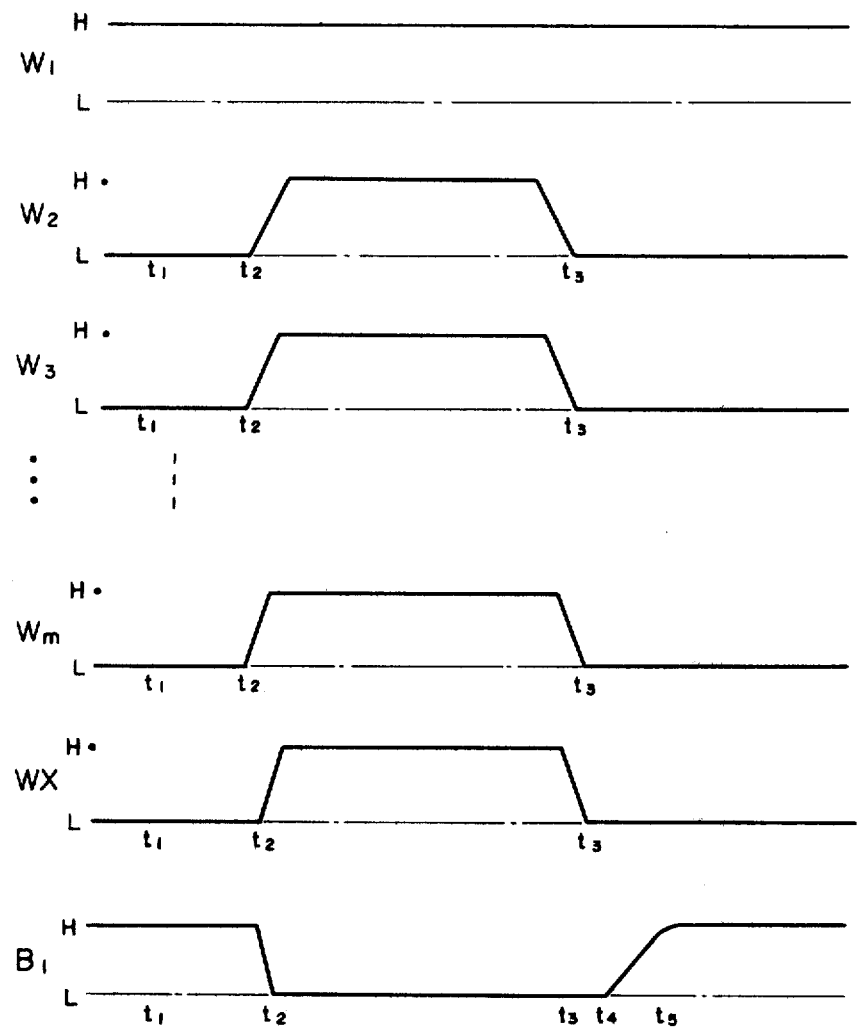
FIG. 5 illustrates the changes of the potentials of the word lines and the bit line of the device of FIG. 3.

The operation of the device of FIG. 3 will be described hereinafter with reference to FIG. 5, which illustrates the changes of the potentials of the word lines $w_1$ through $w_m$ and the bit line $B_1$. The assumed conditions of the device of FIG. 3 are the same as described hereinbefore with reference to FIG. 2.

Figure 1:
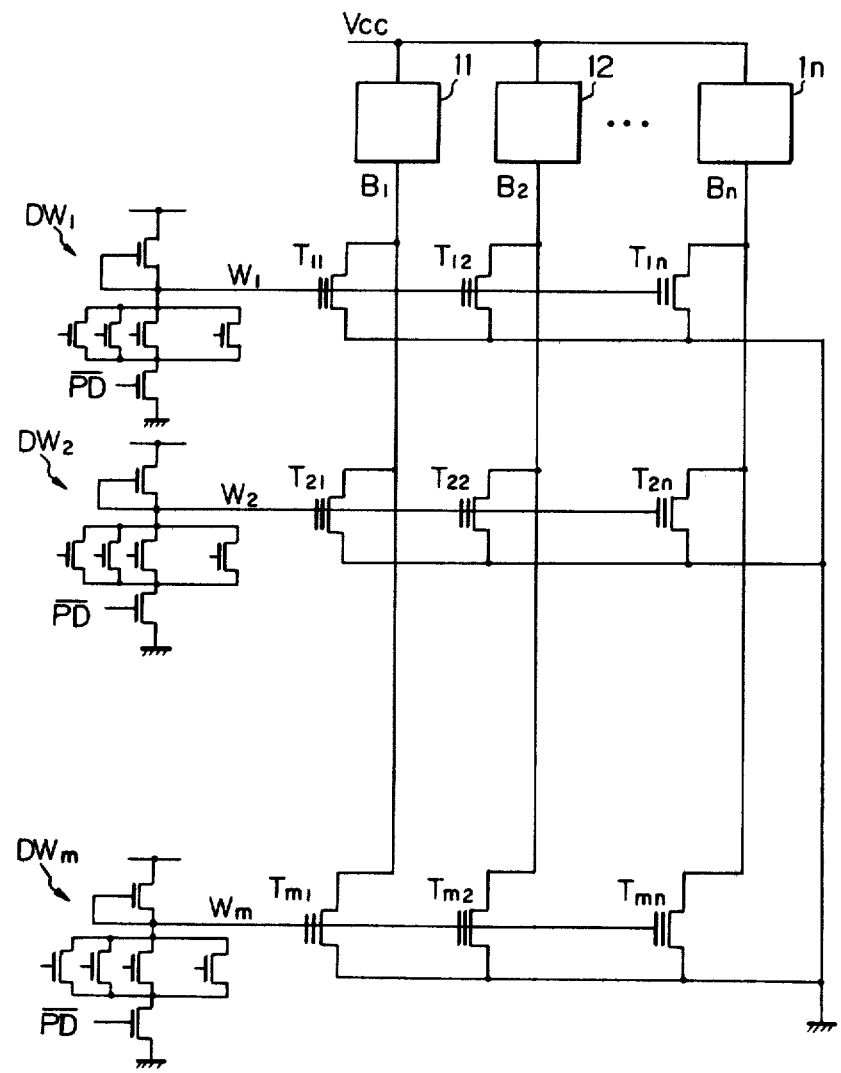
FIG. 1 illustrates the circuit of the prior art EPROM device of the double gate FAMOS type.
Figure 2:
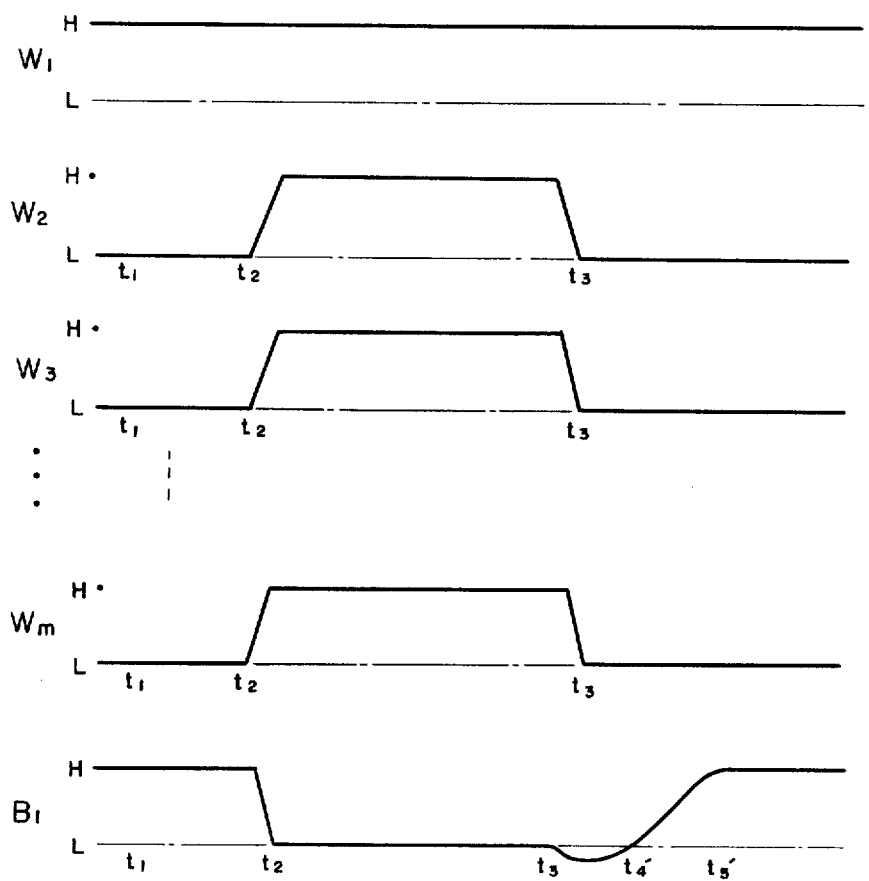
FIG. 2 illustrates the changes of the potentials of a word lines and the bit line of the device of FIG. 1.

During the period $t_1$ through $t_3$, the changes of the potentials of the word lines $w_1$ through $w_m$ and the bit line $B_1$ are the same as in the device of FIG. 1. The potential of the added word line $w_x$ is switched to HIGH during the period $t_2$ through $t_3$, as are the potentials of the word lines $w_2$ through $w_m$. After the period $t_2$ through $t_3$, the potential of the added word line $w_x$ is caused to be LOW approximately simultaneously with the fall of the potentials of the word lines $w_2$ through $w_m$. Thus, during the period $t_3$ through $t_4$, the bit lines $B_1$, $B_2$ . . . $B_n$ are supplied with currents through the added transistors $TX_1$, $TX_2$ . . . $TX_n$, and accordingly, the potentials of the bit lines $B_1$ $B_2$ . . . $B_n$ are unfailingly maintained equal to the level L. Accordingly, after the charging of the bit line $B_1$ starts at $t_4$ through the load circuit 11, the potential of the bit line $B_1$ reaches a HIGH level at $t_5$, which is earlier than $t_5'$ in FIG. 2. For example, in the case where only a few number of cells in the ON state are connected to the bit line $B_1$, if the period $t_3$ through $t_4'$ of FIG. 2 is approximately 300 ns, the period $t_3$ through $t_4$ of FIG. 5 is approximately 100 ns, so that the time $t_5$ is 200 ns earlier than the time $t_5'$. Thus, the speed of charging of the bit line $B_1$ is increased and, accordingly, the speed of operation of the device of FIG. 3 is increased compared with that of the device of FIG. 1, which are the desired results of subject invention.

Although a preferred embodiment of the present invention has been described hereinbefore, various modifications of the structure of the device are possible. For example, the type of transistors used in the device of FIG. 3 is not limited to FAMOS, and other types of transistors, such as ordinary MOS transistors or bipolar transistors, may be used. Also, the type of memory devices used in the device of FIG. 3 is not limited to EPROM, and ordinary ROMs may be used.

I claim:

1. A semiconductor memory device comprising a plurality of word lines, a plurality of bit lines and a plurality of cell transistors, each of which is connected between one of said bit lines and a point of the reference potential, characterized in that additional transistors are connected between said bit lines and said point of reference potential, whereby suppression of the lowering of the potential of a bit line is effected by said additional transistors when said semiconductor memory device changes from the non-operative state into the operative state.

2. A semiconductor memory device comprising:
   a reference potential;
   a plurality of word lines;
   a plurality of bit lines;
   a plurality of cell transistors, each of which is connected between one of said bit lines and said reference potential;
   means for suppressing the lowering of the potential of a bit line when the semiconductor memory device changes from a non-operative state into an operative state;
   said means including a plurality of additional transistors connected between said bit lines and said reference potential.

3. The semiconductor memory device of claim 2, wherein said additional transistors are of the MOS type.

4. A semiconductor memory device as set forth in claim 2, wherein said additional transistors are of the FAMOS type.

* * * * *